US006158454A

United States Patent [19]

Duret et al.

[11] Patent Number: 6,158,454

[45] Date of Patent: Dec. 12, 2000

[54] SIEVE LIKE STRUCTURE FOR FLUID FLOW THROUGH STRUCTURAL ARRANGEMENT

[75] Inventors: Michael J. Duret, Pleasanton; Erin Martin Hasenkamp, San Jose, both of Calif.; Jeffrey R. Markulec, Princeton, N.J.; Dennis G. Rex, Sunnyvale; Richard E. Schuster, Milpitas, both of Calif.

[73] Assignee: Insync Systems, Inc., Santa Clara, Calif.

[21] Appl. No.: 09/060,519

[22] Filed: Apr. 14, 1998

[51] Int. Cl.[7] .............................. F24F 11/00; C23C 16/00

[52] U.S. Cl. .............................. 137/1; 137/884; 137/270; 118/715; 62/418

[58] Field of Search ................................ 118/715; 137/1, 137/2, 10, 12, 14, 269, 271, 884, 270; 65/80.3; 62/259.2, 418

[56] References Cited

U.S. PATENT DOCUMENTS

| | | | |
|---|---|---|---|
| 4,399,485 | 8/1983 | Wright et al. | 361/383 |
| 4,625,627 | 12/1986 | Livanos et al. | 98/32 |
| 4,901,138 | 2/1990 | Kushibiki et al. | 357/81 |
| 5,025,834 | 6/1991 | Stoll | 137/560 |
| 5,101,710 | 4/1992 | Baucom | 454/238 |
| 5,107,897 | 4/1992 | Stoll | 137/884 |
| 5,137,047 | 8/1992 | George | 137/240 |
| 5,178,191 | 1/1993 | Schaefer | 137/884 |
| 5,440,477 | 8/1995 | Rohrberg et al. | 364/188 |
| 5,488,925 | 2/1996 | Kumada | 118/715 |
| 5,529,088 | 6/1996 | Asou | 137/343 |
| 5,563,768 | 10/1996 | Perdue | 361/695 |
| 5,605,179 | 2/1997 | Strong et al. | 137/884 |
| 5,607,002 | 3/1997 | Siegele et al. | 141/198 |
| 5,662,143 | 9/1997 | Caughran | 137/884 |
| 5,671,610 | 9/1997 | Shin | 62/418 |
| 5,671,805 | 9/1997 | Stahl et al. | 165/80.3 |
| 5,732,744 | 3/1998 | Barr et al. | 138/106 |
| 5,810,031 | 9/1998 | Evan et al. | 137/557 |
| 5,819,782 | 10/1998 | Itafuji | 137/240 |
| 5,836,355 | 11/1998 | Markulec et al. | 137/884 |
| 5,847,927 | 12/1998 | Minning et al | 361/696 |
| 5,860,676 | 1/1999 | Brzezicki et al. | 285/24 |
| 5,863,023 | 1/1999 | Evans et al. | 251/63.5 |

FOREIGN PATENT DOCUMENTS

| | | | |
|---|---|---|---|
| 2236004 | 7/1971 | Germany . | |

*Primary Examiner*—Jeffrie R Lund

*Attorney, Agent, or Firm*—Wolf, Greenfield & Sacks, P.C.

[57] ABSTRACT

Generally, A system for providing fluid flow through a structural arrangement is described. Specifically, a containment system for a modular gas system is described.

In the present invention, air flow enters an encasement entry port. The air travel through a channel to a mounting plane enter surface area. The air flow is directed through the mounting plane and then through the modular gas system. From there, air flow is directed within an encasement towards an exit port. The air then enters a capture system which contains any gas that may have escaped the gas system and vents off purified air.

In an alternate embodiment, the channel couples the gas system exit surface area to the exit port. In another alternate embodiment, the channel couples the mounting plane exit surface area to the exit port. In yet another embodiment, the channel couples the entry port to the gas system enter surface area.

Additionally, many details that may apply to any of the above embodiments or an embodiment of the present invention are described. These include, a small cross sectional area entrance port to maximize intake air flow, a plugs for openings in the mounting plane that reside beneath wide gaps in the gas system, passages in the channel sidewalls to remove dead spots in the encasement, additional entrance ports to allow the removal of various dead spots within the encasement.

58 Claims, 10 Drawing Sheets

SIEVE LIKE STRUCTURE FOR FLUID FLOW THROUGH STRUCTURAL ARRANGEMENT

BACKGROUND OF THE INVENTION

1. Field of the Invention

The present invention relates to the field of gas delivery systems and, more specifically, to an apparatus used to trap dangerous or flammable gasses that may escape during semiconductor manufacturing.

2. Discussion of Related Art

Gas panels are used to control the flow of gases and gas mixtures in many manufacturing processes and machinery. A typical gas panel, such as gas panel 100 shown in FIG. 1*a,* is made up of literally hundreds of discreet or individual components, such as valves 102, filters 104, flow regulators 106, pressure regulators 107, pressure transducers 109, and connections 108, connected together by tens (or hundreds) of feet of tubing 110. Gas panels are designed to provide desired functions, such as mixing and purging, by uniquely configuring the various discreet components. A traditional gas panel 100 has two components: a gas system 115 and a mounting plane 116. The gas system 115 is the collection of discrete components (e.g., valves 102, filters 104, flow regulators 106) and their interconnections (e.g., tubing 110). The mounting plane 116 is the base the gas system 115 is mounted to.

FIG. 1*b* shows a traditional apparatus 190 used to capture gases that leak from traditional gas system 115. FIG. 1*b* shows traditional gas system 115 mounted to mounting plane 116. For purposes of FIG. 1*b,* the various discrete components (e.g., valves 102, filters 104, flow regulators 106 of FIG. 1*a*) may simply be referred to as a whole; that is, as functional elements or components 121.

Both traditional gas system 115 and mounting plane 116 are completely enclosed within an encasement 120. Capture system 118 is used to trap gases that may leak from traditional gas system 115. Capture system 118 also acts as a vacuum that draws air flow 112 into input port 111. The air flow 113 in encasement 120 flows throughout the entirety of the volume of encasement 120. Any leaked gases will be picked up by the air flow 113 in encasement 120 and drawn into capture system 118. Capture system 118 captures leaked gases from traditional gas system 115 such that only clean air 119 escapes capture system 118. Thus, only clean air 119 is vented into the environment.

In standard gas panels 100, traditional gas system 115 is hand and custom made. The functional elements 121 of traditional gas system 115 have regions 114 between them that are fairly large so the air flow 113 in encasement 120 easily flows in between the functional components 121 of traditional gas system 115. Leaked gas from traditional gas system 115 will most likely reside in regions 114. Thus leaked gas is easily drawn outside encasement 120 through exit port 117 into the capture system 118.

A problem with present gas panels 100 is that most of them are uniquely designed and configured to meet specific needs. Today there is simply no standard design in which gas panels are configured. Today it takes weeks to months to design a gas panel, fabricate all subassemblies, and then assemble the final product. Uniquely designing or configuring each new gas panel costs time and money. Additionally, the lack of a standard design makes it difficult for facilities' personnel to maintain, repair, and retrofit all the differently designed gas panels which may exist in a single facility. The unique designs require an intensive manual effort which results in a high cost to the customer for customized gas panels. Customized gas panels also make spare parts inventory management cumbersome and expensive.

Referring back to FIG. 1*a,* another problem with present gas panels is a large number of fittings 108 and welds required to interconnect all of the functional components. When tubes are welded to fittings 108, the heat generated during the welding process physically and chemically degrades the electropolish of the portion of the tube near the weld (i.e., the heat affected zone). The degraded finish of the heat affected zone can then be a substantial source of contaminant generation. Additionally, during the welding process metal vapor, such as manganese, can condense in the cooler portions of the tube and form deposits therein. Also, if elements being welded have different material composition (e.g., stainless steel with inconel), desired weld geometry and chemical properties are difficult to achieve. Thus, gas panels with large numbers of fittings and welds are incompatible with ultra clean gas systems which require extremely low levels of contaminants and particles. Additionally, high purity fittings 108 are expensive and can be difficult to obtain, thereby increasing the cost of any gas panel incorporating them.

Yet another problem associated with present gas panel designs is the large amount of tubing 110 used to route gas throughout the gas panel. Large volumes of tubing require large volumes of gas to fill the system and make it difficult to stabilize and control gas flows. Additionally, gas panels with excessive tubing require significant amounts of time to purge and isolate which can result in expensive downtime of essential manufacturing equipment, resulting in an increase in the cost of ownership. Still further, the more tubing a gas panel has, the more "wetted surface area" it has, which increases its likelihood of being a source of contamination in a manufacturing process.

U.S. Pat. No. 5,836,355 filed on Dec. 3, 1996 has addressed the above issues by disclosing, as shown in FIG. 2*a,* modular building blocks 202, 204 for a modular gas system 200. The use of such building blocks greatly simplifies the design and reduces the technical shortcomings associated with current gas panel technology. FIG. 2*a* shows various functional components 206. The functional components 206 of FIG. 2*a* are similar to the functional components or elements 121 of FIG. 1*b*. That is, for purposes of FIG. 2*a,* the functional elements 206 may be labeled as a whole even though their exact shape and/or function is different. Each functional component 206 is mounted to a modular block 202. Functional elements 206 have fluid communication in the + and −x direction through the modular base blocks 202. Functional elements 206 have fluid communication in the + and −z direction through manifold blocks 204. Manifold blocks 204 reside beneath the collection of functional elements 206 and modular base blocks 202.

Comparing FIG. 2*a* with FIG. 1*a,* the expensive tubing 110 associated with traditional gas panels 100 (referring briefly back to FIG. 1*a*) is eliminated with the modular gas system 200. Furthermore, the functional components 206 of the modular gas system 200 are more densely packed than the functional elements (e.g., valves 102, filters 104, flow regulators 106) of the traditional custom made gas system 115. Thus the modular gas system 200 is dense. A dense gas system is a gas system that has narrow gaps or narrow gap regions. Narrow gaps are indistinguishable from narrow gap regions and are used interchangeably throughout this application. Narrow gaps, in this example, are vacancies within gas system 200 that have at most negligible fluid flow if the traditional apparatus 190, 290 is employed. Referring now to FIG. 2*b*, the increased packing density of the modular gas system 215 results in the aforementioned narrow gap regions 214 within modular gas system 215. As discussed, narrow gap regions 214 cause lack of air flow in between the various structures associated with gas system 215. As shown in FIG. 2*b* the narrow gap regions 214 exist between neighboring functional elements 206. However, it has been observed in practice that the narrowest gaps reside between neighboring gas sticks. Gas sticks are not shown in FIG. 2*b* and are discussed in greater detail further ahead in the detailed description of the invention. Thus FIG. 2*b* merely serves as an illustrative example of the reduced vacancy feature sizes associated with modular gas system 200.

The lack of air flow caused by narrow gaps 214 results in various violations of semiconductor manufacturing safety requirements. For example Sematech specification SEMI S2-93A sec. 10 is interpreted by some original equipment manufacturers (OEMs) to require a minimum of 50 feet per minute throughout encasement structure 220. The lack of air flow results in a failure of this requirement. Further industry requirements not associated with SEMI S2-93A include: 100 feet per minute next to any flammable gas (such as hydrogen, ammonia, dichlorosilane) critical connection; 200 feet per minute near any critical connection of pyrophoric gas (e.g., silane); leak proof encasements 220. Thus the traditional apparatus 290 of FIG. 2*b* is inadequate for a modular gas system 215.

What is needed is a new apparatus that successfully introduces air flow between the densely packed functional elements 206 of the modular gas system 215. A mounting plane with openings that permits air flow into the gas system 215 is an example of such an improved apparatus.

SUMMARY OF THE INVENTION

Generally, a system for providing fluid flow through a structural arrangement is described. Specifically, a containment system for a modular gas system is described.

In the present invention, air flow enters an encasement entry port. The air travels through a channel to a mounting plane enter surface area. The air flow is directed through the mounting plane and then through the modular gas system. From there, air flow is directed within an encasement towards an exit port. The air then enters a capture system which contains any gas that may have escaped the gas system and vents off purified air.

In an alternate embodiment, the channel connects the gas system exit surface area to the exit port. In another alternate embodiment, the channel connects the mounting plane exit surface area to the exit port. In yet another embodiment, the channel connects the entry port to the gas system enter surface area.

Additionally, many details that may apply to any of the above embodiments (or an embodiment of the present invention) are described. These include, a small cross sectional area entrance port to maximize intake air flow, plugs for openings in the mounting plane that reside beneath wide gaps in the gas system, passages in the channel sidewalls to remove dead spots in the encasement and additional entrance ports to allow the removal of various dead spots within the encasement.

DETAILED DESCRIPTION OF THE PRESENT INVENTION

The present invention describes a novel apparatus for introducing air flow into a gas system for semiconductor manufacturing composed of interconnected modular building blocks. In the following description numerous specific details are set forth (such as particular modular building blocks, a particular mounting plane and particular direction of air flow) in order to provide a thorough understanding of the present invention. It will be obvious, however, to one skilled in the art that the present invention may be practiced without these specific details. In other instances well known mechanical assembly, machining and manufacturing techniques have not been set forth in particular detail in order to not unnecessarily obscure the present invention.

In the present invention, air flow enters an encasement entry port. The air travels through a channel to a mounting plane enter surface area. The air flow is directed through the mounting plane and then between elements of the modular gas system. From there, air flow is directed within an encasement towards an exit port. The air then enters a capture system which contains any gas that may have escaped the gas system and then vents off purified air. In an alternate embodiment, the channel connects the gas system exit surface area to the exit port. In another alternate embodiment, the channel connects the mounting plane exit surface area to the exit port. In yet another embodiment, the channel connects the entry port to the gas system enter surface area. Additionally, many details that may apply to any of the above embodiments or an embodiment of the present invention are described. These include, a small cross sectional area entrance port to maximize intake air flow, plugs for openings in the mounting plane that reside beneath wide gaps in the gas system, passages in the channel sidewalls to remove dead spots in the encasement and additional entrance ports to allow the removal of various dead spots within the encasement.

Figure 3A:
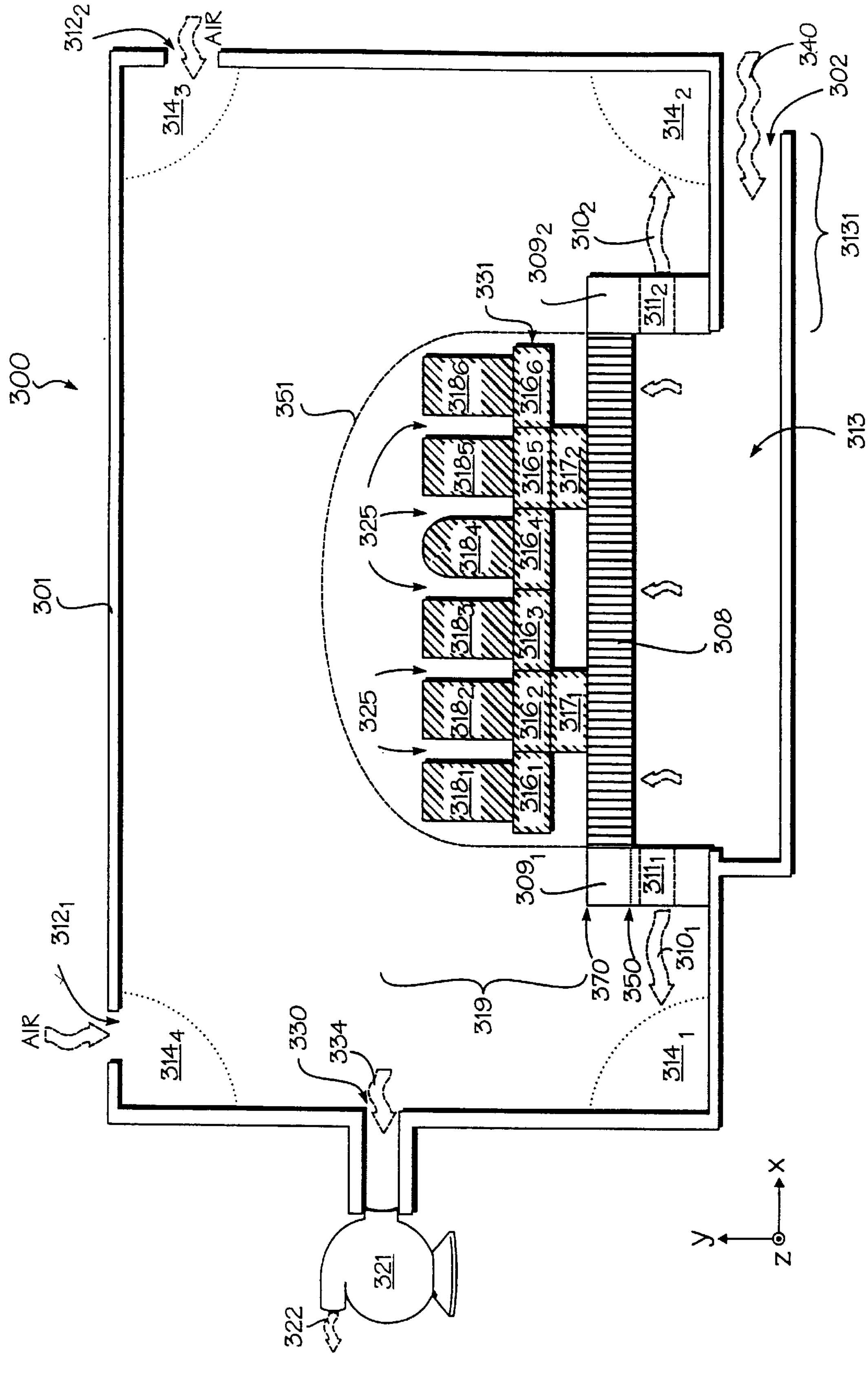
FIG. 3*a* is an illustration of an apparatus of an embodiment of the present invention in the −z direction.
Figure 3B:
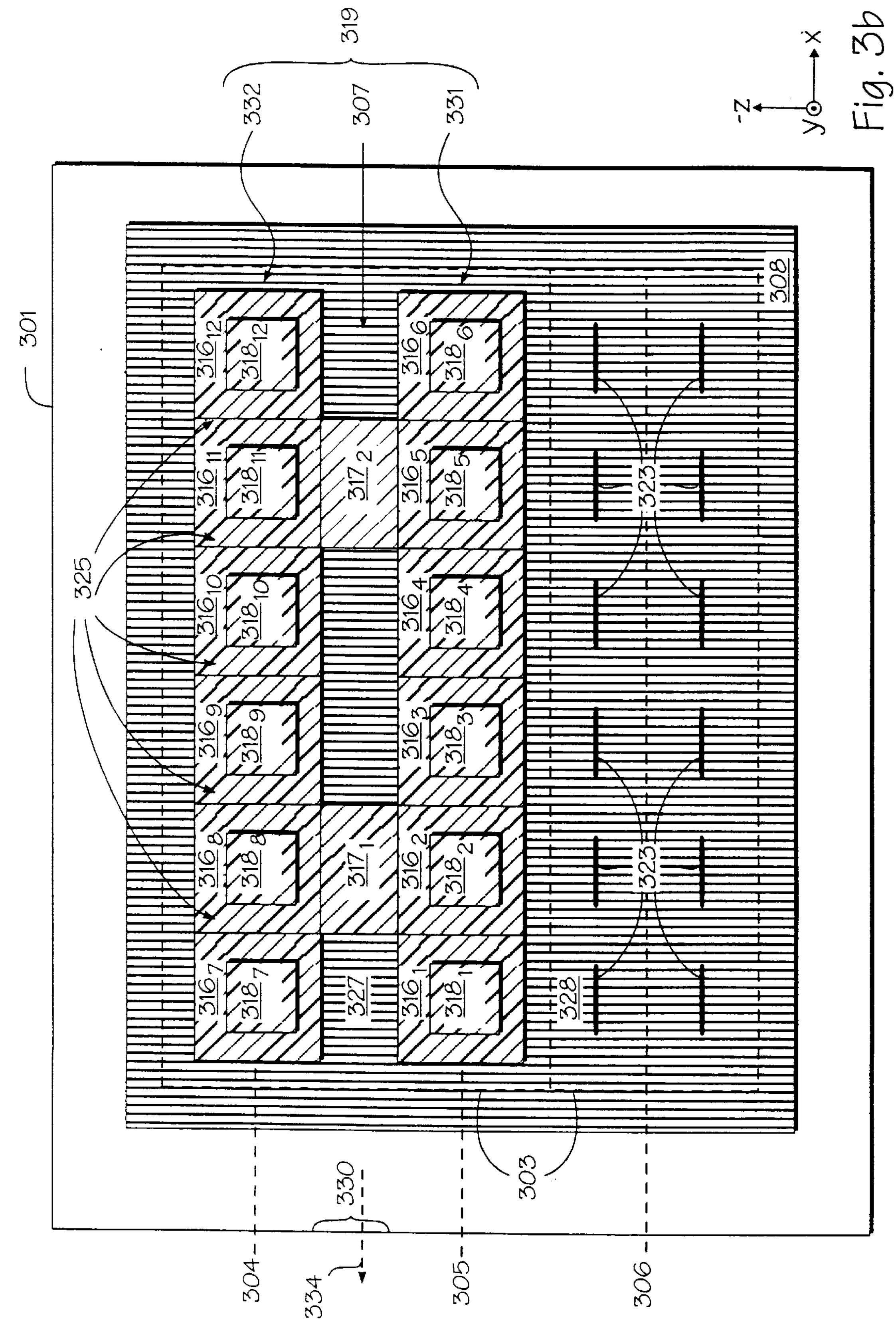
FIG. 3*b* is an illustration of an encasement of an embodiment of the present invention in the −y direction.
Figure 3C:
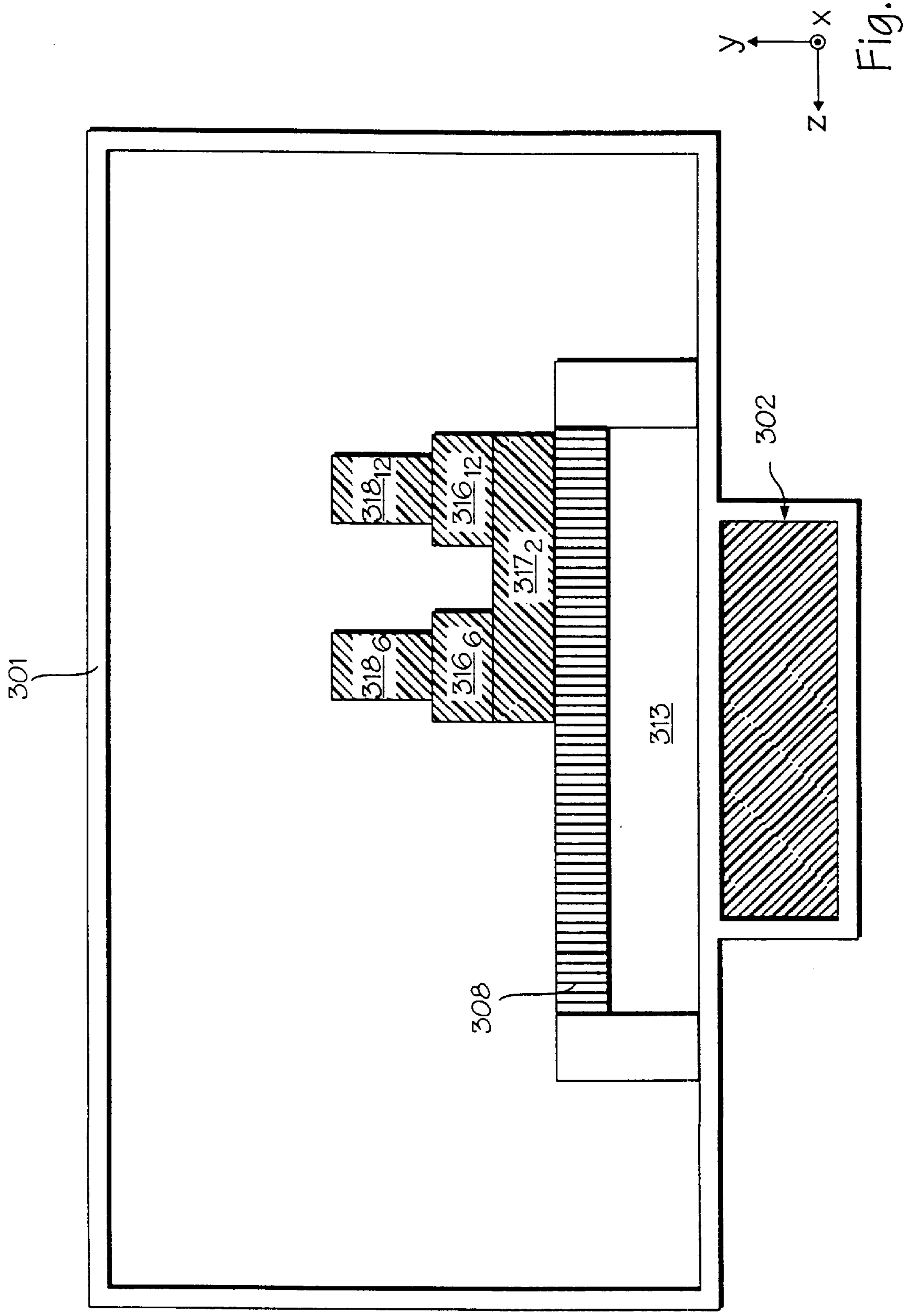
FIG. 3*c* is an illustration of an encasement of an embodiment of the present invention in the −x direction.
Figure 4:
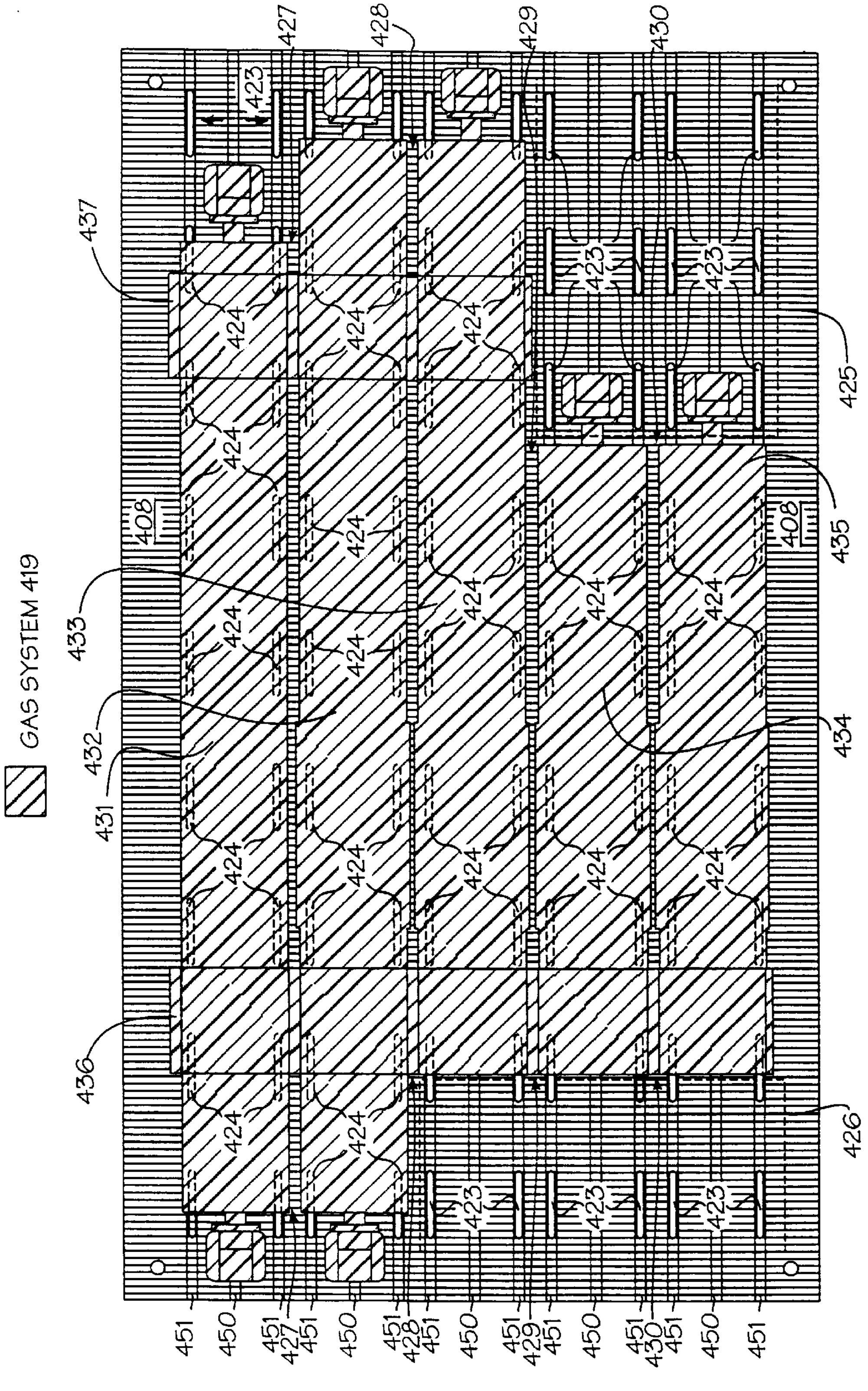
FIG. 4 is an illustration of the gas system and mounting plane for an embodiment of the present invention.

FIGS. 3*a*, 3*b* and 3*c* show an embodiment of the present invention from three different perspectives (looking into the −z, −y and −x directions respectively). Referring to FIGS. 3*a* and 3*b*, apparatus 300 properly introduces air flow in narrow gap 307 that exists between neighboring gas sticks 331 and 332. Narrow gap 307 between neighboring gas sticks 331 and 332 is in practice much narrower (being approximately 0.2 inches) than the gaps 325 between neighboring functional elements 318. Thus, the drawing in FIG. 3 of gas system 319 is not to scale and serves only to illustrate that various concepts discussed herein. Even so, it is possible that large functional elements 318 or functional elements 318 with complex shapes may exist such that gaps 325 are narrow enough to impermissibly restrict air flow within gaps 325. A drawing more to scale of the gas system applied to this invention is shown in FIG. 4. FIG. 4 is discussed infra.

Continuing with a description of the invention, air flow 340 from the manufacturing environment is introduced at entry port 302. The air flow continues into a channel 313 whereby the air then flow flows (in the +y direction) through the mounting plane 308 and into gas system 319. The air flow then flows through the body of encasement 301 toward exit port 330. From exit port 330 the air flow 334 travels into capture system 321. Capture system 321 essentially filters the air flow such that any gas leaks from gas system 319 (that are caught by the air flow through gas system 319) are captured by capture system 321. Capture system 321 then directs the captured gas leaks to a central waste management system. Clean air 322 is vented back into the environment. Capture system 321 also creates a vacuum that draws air flow through the apparatus 300. That is, capture system 321 also acts as an air flow source. An air flow source is simply any apparatus used to introduce air into an entry port.

The basic element of the improved apparatus 300 is an encasement 301. Encasement 301 is typically (although does not need to be) a box like structure typically composed of sheet metal. Within the encasement 301 is gas system 319. In an embodiment of the present invention, mounting plane 308 serves as a boundary of encasement 301. In the traditional capture system, shown back in FIGS. 1*b* and 2*b,* the encasement 120, 220 simply ensures that escaped gas is contained in the encasement before being swept into the capture system 118, 218. The encasement 301 of an embodiment of the present invention, shown in FIGS. 3, serves substantially the same purpose; however, it is possible that gas will leak outside the encasement 301 and into channel 313. The present invention addresses this problem but its discussion is reserved until later in this description.

As shown in FIGS. 3*a* and 3*b* (and as described in U.S. Pat. No. 5,836,355), gas system 319 is composed of functional elements 318, modular base blocks 316 and manifold blocks 317. Functional elements $\mathbf{318}_{1\text{-}12}$ are mounted to their corresponding modular base blocks $\mathbf{316}_{1\text{-}12}$. Inside modular base blocks 316 are passages that allow fluid flow between the inside of the modular block 316 and its corresponding functional element 318. The passages within the modular base blocks 316 run to a face of each modular block 316 such that neighboring modular base blocks (e.g., $\mathbf{316}_{1\text{-}2}$) are in fluid communication with each other. The result is that neighboring functional elements (e.g. $\mathbf{318}_1$ and $\mathbf{318}_2$) are in fluid communication with each other. In this manner, a complex gas system 319 can be designed and implemented.

FIG. 3*b* is a top view from the inside of the encasement 301. Gas system 319 has two gas sticks 331, 332. Referring to both FIGS. 3*a* and 3*b,* modular base blocks $\mathbf{316}_{1\text{-}6}$ are coupled together to form gas stick 331. Similarly, modular base blocks $\mathbf{316}_{7\text{-}12}$ are coupled together to form gas stick 332. Gas sticks 331, 332 are positioned on mounting plane 308 such that they run along the x direction. Gas stick 331 essentially allows fluid communication (along the x axis) between the functional elements $\mathbf{318}_{1\text{-}6}$. Gas stick 332 allows fluid communication (along the x axis) between functional elements $\mathbf{318}_{7\text{-}12}$. Gas sticks 331, 332 are mounted directly to manifold blocks $\mathbf{317}_1$ and $\mathbf{317}_2$. Gas sticks 331 and 332 are in fluid communication with each other through manifold blocks $\mathbf{317}_1$ and $\mathbf{317}_2$. Manifold blocks 317 are blocks that (either with one manifold block or via a string of interconnected manifold blocks) interconnect adjacent gas sticks 331, 332. Manifold blocks 317 run along the z axis and are directly mounted to mounting plane 308.

Thus in an embodiment of the present invention, gas system 319 is mounted to mounting plane 308 via manifold blocks 317. The mounting plane 308 is similar to the mounting plane disclosed in U.S. patent application Ser. No. 08/893,773 filed on Jul. 11, 1997. The mounting plane 308 technology is critical to the realization of a gas system 319 sufficient for semiconductor manufacturing purposes. Specifically, the modular base blocks 316 must be precisely aligned with one another and with manifold blocks 317 in order to ensure leak proof seals between neighboring modular base blocks (e.g., $\mathbf{316}_1$ and $\mathbf{316}_2$). Thus mounting plane 308 serves not only as a convenient base for organizing gas system 319, but also as a critical alignment tool for realizing modular gas system 319.

Referring to FIG. 3*b,* the mounting plane 308 of an embodiment of the present invention differs from that disclosed in U.S. patent application Ser. No.08/893,773 in that holes or openings 323 exist in mounting plane 308 for the purpose of allowing air flow into the gas system 319. That is, air flows between adjacent gas sticks 331, 332 and through narrow gaps 307 that exist in gas system 319. In an embodiment of the present invention, adjacent gas sticks 331, 332 are centered approximately 1.7 inches apart (along the z axis); given the width of a gas stick 331, 332 (1.5 inches), narrow gaps 307 are approximately 0.2 inches wide. Air flow in the +y direction from channel 313 (referring briefly to FIG. 3*a*) is introduced through openings 323 in mounting plane 308 that allows the air flow to continue into gas system 319. Openings similar to openings 323 exist beneath gas sticks 331 and 332; however, they are not visible in FIG. 3*b* because they reside underneath gas sticks 331, 332. The air flow flows up through narrow gaps 307 between gas sticks 331, 332 and eventually through other narrow gaps that may exist within gas system 319. This air flow essentially removes gas leaks that could otherwise remain within the vicinity of gas system 319 if a traditional capture system is used.

Mounting plane 308 has surface areas that lie in the xz plane through which the air flow traveling through mounting plane 308 travels. There are two surface areas: one surface area where air flow enters mounting plane 308 (the "mounting plane enter surface area") and another surface area, surrounded by boundary line 303, where air flow exits mounting plane 308 (the "mounting plane exit surface area"). The mounting plane 308 enter surface area is the surface area of mounting plane 308 where air intended to flow through the mounting plane 308 enters the mounting plane 308. The mounting plane 308 exit surface area is the surface area of mounting plane 308 where air flow that has traveled through mounting plane 308 leaves mounting plane 308. The mounting plane 308 exit surface area, being bounded by line 303, is easily seen in FIG. 3*b*. The mounting plane 308 enter surface area is not seen in FIG. 3*b* because it lies on the underside of mounting plane 308; however, it is obvious that mounting plane 308 enter surface area is equal in size to the region bounded by line 303.

Referring back to FIG. 3*a,* because an embodiment of the present invention envisions directing air flow through the mounting plane 308 before directing air flow through gas system 319, the mounting plane 308 exit surface area is positioned at 370 on the y axis. Mounting plane 308 enter surface area is located at 350 on the y axis.

Gas system 319 also has entrance and exit surface areas that, to a large degree, lie in the xz plane. The gas system 319 surface areas are similar to the surface areas described in regard to mounting plane 308. Gas system 319 enter surface area is the surface area surrounding gas system 319 through which air passes in order to enter the gas system 319 region. Gas system 319 exit surface area is the surface area surrounding gas system 319 through which all air flow that has passed through gas system 319 passes in order to escape the gas system 319 region.

Referring to FIG. 3*a,* the gas system 319 enter surface area is also positioned along the y axis at 370. Even though the shape of the gas system 319 is irregular, a smooth surface area may be envisioned that essentially spans the area surrounding the gas system 319 region through which air flow current directed at gas system 319 must travel in order to enter the gas system 319 region. Because gas system 319 is fixed to the mounting plane 308, the mounting plane 308 exit surface area and the gas system 319 entrance surface area are both located at the same y axis location 370.

Referring now to FIG. 3*b,* note that although gas system 319 only has two gas sticks 331, 332 (at axis 304 and axis 305 respectively), it could have three. That is a third gas stick could be centered on axis 306. The gas system 319 enter surface area is assumed to include areas 328 where gas sticks may appear but do not necessarily have to. That is, air from the channel 313 coming up through mounting plane 308 and into gas system 319 enter surface area flows through holes 323 in the perforated mounted plane 308. Thus, gas system 319 enter surface area includes region 328 just above mounting plane 308 (where no gas stick is placed) as well as region 327 just above mounting plane 308 (where gas sticks 331, 332 are placed). Gas system 319 enter surface area therefore includes the regions 327, 328 surrounded by boundary 303. Gas system 319 enter surface area is approximately the same shape and size as mounting plane 308 exit surface area. This ensures the most efficient air flow through into gas system 319. That is, the total volumetric flow rate drawn by capture system 321 (referring briefly back to FIG. 3*a*) is evenly distributed across gas system 319 enter surface area. The present invention is not limited to this restriction, however. The region 328 is referred to as a wide gap 328 in gas system 319. The size of a wide gap 328 is approximately at least as large as a single modular base block 316 and may be as large as multiple gas sticks. A more general definition of a wide gap is provided further ahead in this description.

Referring back to FIG. 3*a,* a linear segment 351 of gas system 319 exit surface area is shown. Again, even though the gas system 319 has an irregular shape, a smooth surface may be envisioned through which all air that has entered gas system 319 must pass in order to exit the gas system 319 region. Linear segment 351 is a section of such a smooth surface.

Continuing with the description of the improved apparatus 300 of FIG. 3, channel 313 connects mounting plane 308 enter surface area with entry port 302. An entry port allows air flow into the encasement 301 or channel 313. Thus, air flow 340 is directed from entry port 302 through channel 313. A channel is simply a structure that assists in the directing of an isolated or nearly isolated fluid flow within the apparatus. Air flow is then directed, in the +y direction, through mounting plane 308 enter surface area, through the openings (such as 323, referring briefly to FIG. 3*b*) in mounting plane 308 and then through the mounting plane 308 exit and gas system 319 enter surface areas respectively. Then air flows through the gas system 319 exit surface (shown by line 351 in FIG. 3*a*).

The air flow in encasement 301 is then directed to the exit port 330 and into the capture system 321. Therein gases are filtered and clean air 322 is vented back into the environment. An Exit port allows fluid flow to escape the encasement 301 or the channel.

Figure 1A:
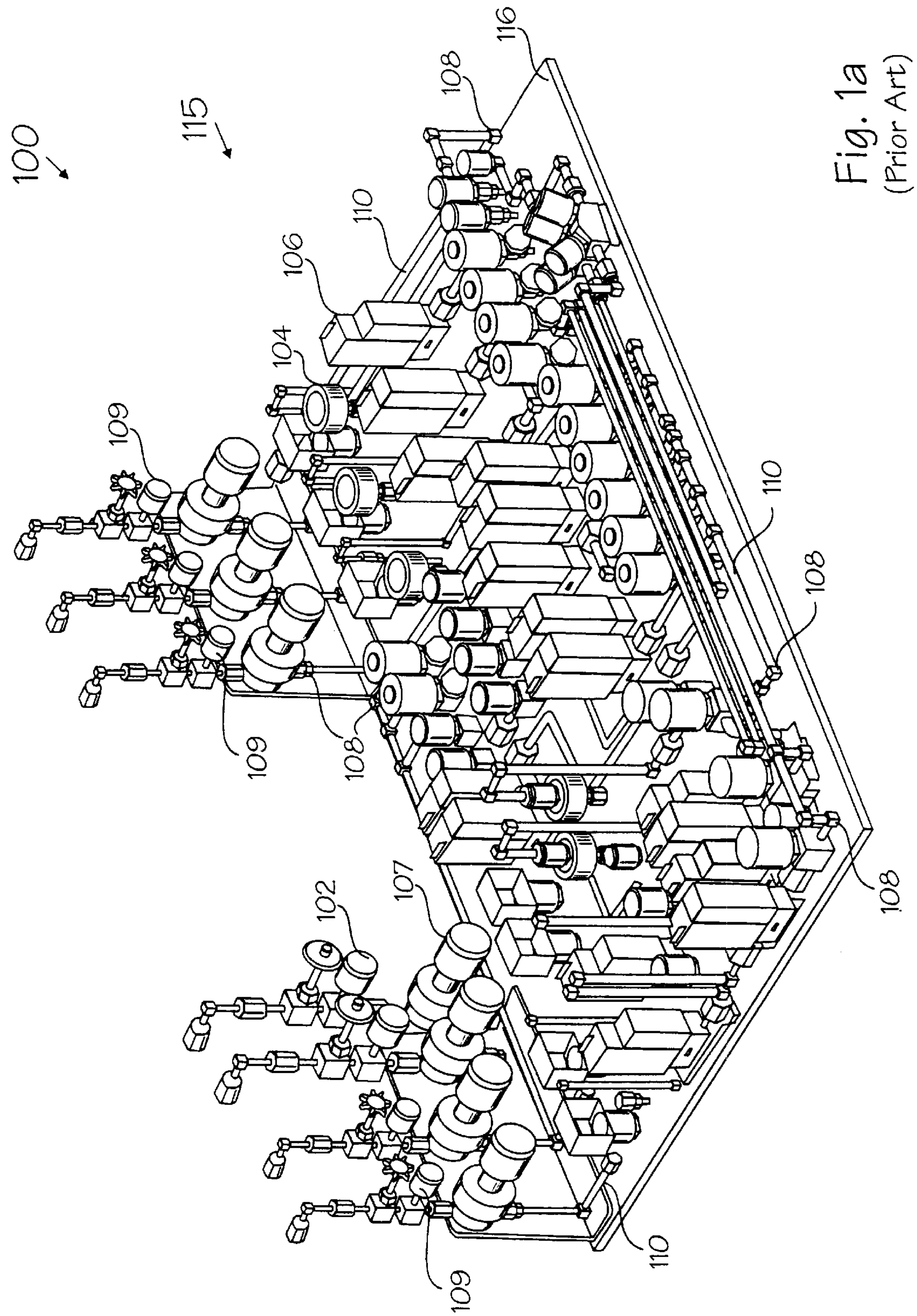
Fig. 1a (Prior Art)
FIG. 1*a* is an illustration of a standard gas panel.
Figure 1B:
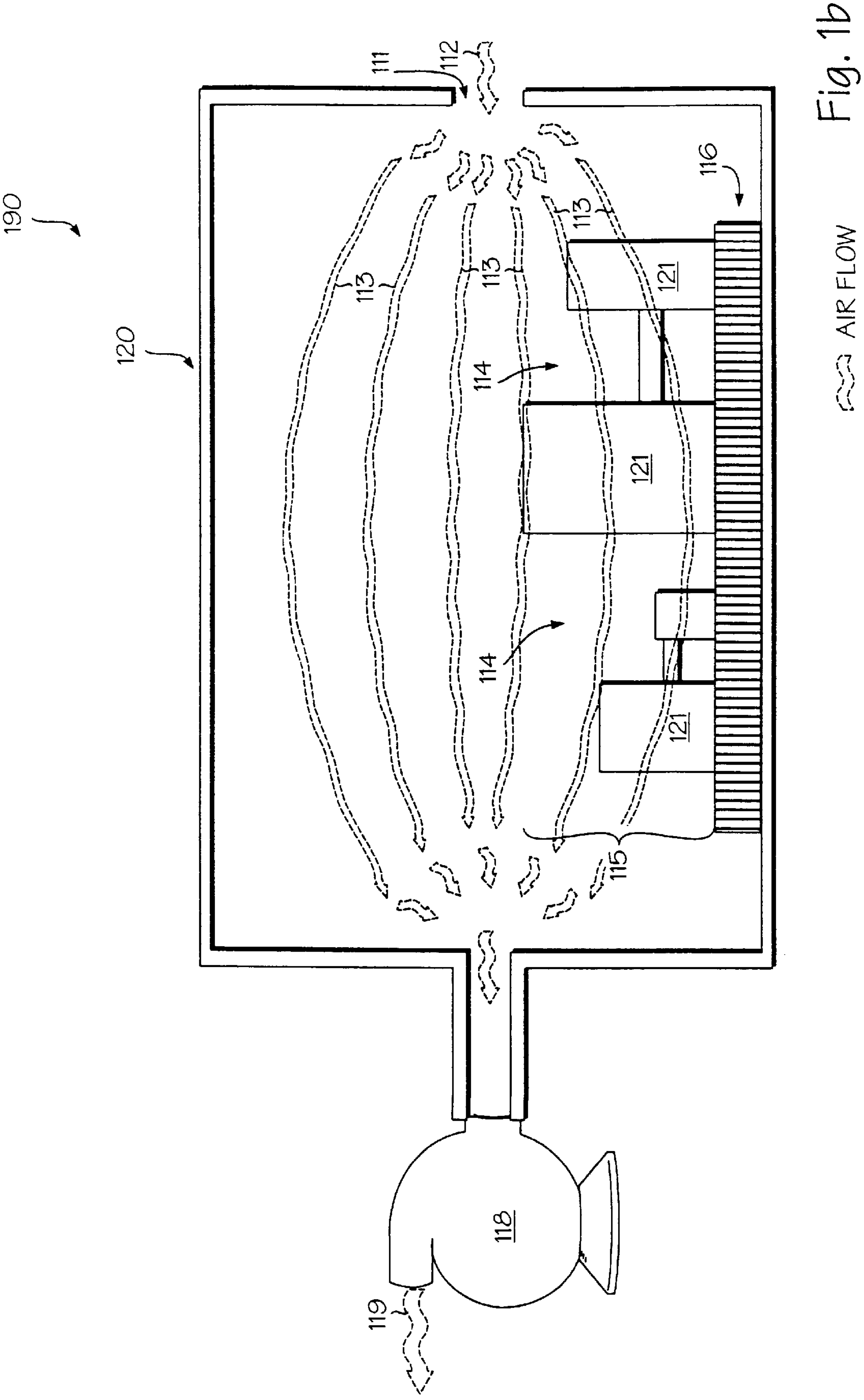
Fig. 1b (Prior Art)
FIG. 1*b* is an illustration of a containment system for a standard gas panel.
Figure 2A:
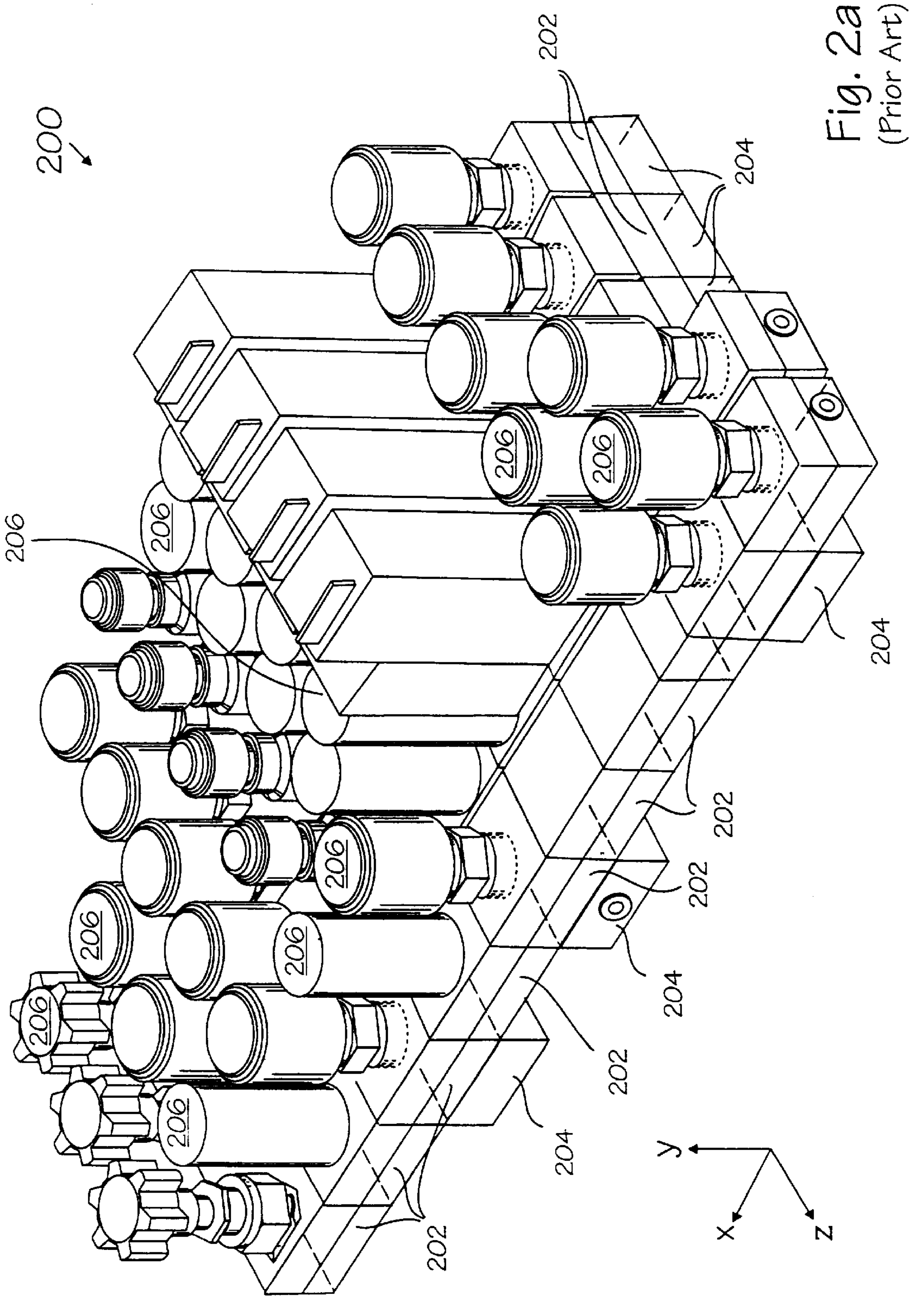
Fig. 2a (Prior Art)
FIG. 2*a* is an illustration of a modular gas system.
Figure 2B:
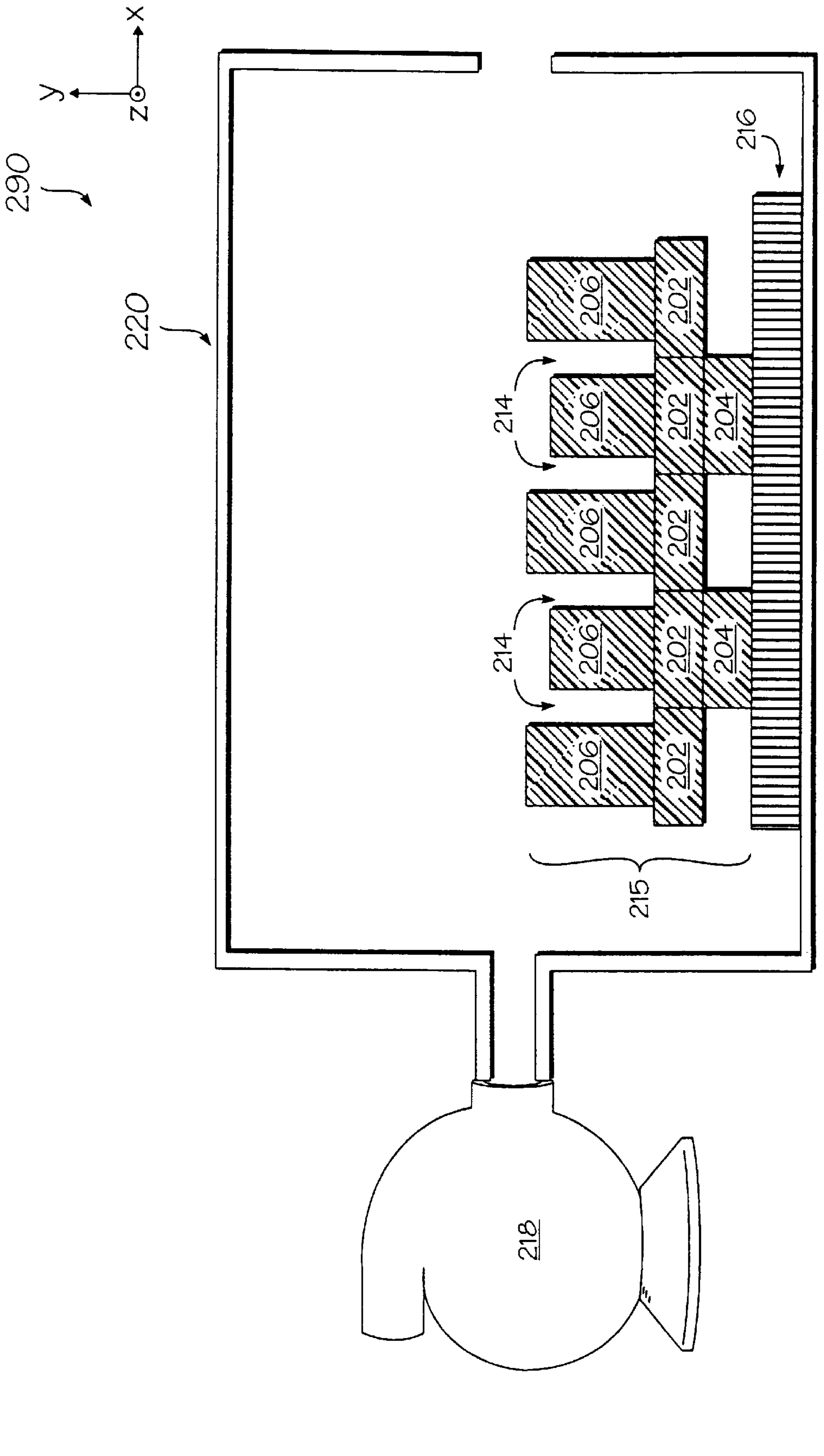
Fig. 2b (Prior Art)
FIG. 2*b* is an illustration of a typical containment system and a modular gas system.

Refer to FIG. 4. FIG. 4 shows gas system 419 and mounting plane 408 in greater detail and at an improved relative scale. Here, five gas sticks are seen: 431 through 435. Two manifolds 436, 437 are also seen. Manifold 436 resides under all five gas sticks 431–5 while manifold 437 resides under gas sticks 431, 432 and 433. There are two kinds of gaps to take note of: narrow gaps 427 through 430 and wide gaps outlined by boundaries 425 and 426. Narrow gaps 427 through 430 exist between neighboring gas sticks 431 and 432, 432 and 433, 433 and 434, 434 and 435 respectively. In this embodiment, narrow gaps 427–430 are gaps within gas system 419 that will have insufficient air flow, in light of applicable industry requirements or customs (e.g., the aforementioned OEM interpretation of Semi S2-93A), if a traditional apparatus, similar to that shown in FIGS. 1B and 2B, is used to sweep leaked gases from gas system 419. In order to properly introduce air flow into the narrow gaps 427 through 430, holes 424 are strategically located near narrow gaps 427–430 in the mounting plane 408. In an embodiment of the invention, as discussed, narrow gaps 427–430 are typically 0.2 inches wide. That is, there is typically 0.2 inches between neighboring gas sticks.

Wide gaps in gas system 419 are outlined by boundary 425 and boundary 426. Wide gaps are gaps in gas system 419 through which air flow introduced through openings 423 (that reside directly beneath a wide gap) will substantially fail to contribute to air flow that removes leaked gas from a narrow gap region (e.g., 427–430). That is, wide gaps are region of gas system 419 through which flow is largely wasted. Wasted flow means the flow does not flow, at any time, through a narrow gap region. In this region, wide gaps are approximately at least as large as a single modular base block. In an embodiment of the present invention, modular base blocks are typically 1.5 inches by 1.5 inches.

Note also the periodic placement of holes 423 and 424 in mounting plane 408. In order to ensure mounting precision, gas sticks 431–435 must be placed along mounting tracks 450, 451. Tracks are high precision grooves formed within mounting plane 408. There are two types of mounting tracks: alignment mounting tracks 450 and manifold mounting tracks 451. Alignment mounting tracks 450 are used to align gas sticks 431–435 to the mounting plane 408. Manifold mounting tracks 451 are used to attach manifold blocks 436, 437 directly to the mounting plane 408. In an embodiment of the present invention holes 423, 424 are placed within mounting tracks 451. Thus their placement is limited to a range of predetermined positions. By so limiting holes 423, 424 to manifold mounting tracks 451 they will always reside just beneath and just towards the outer edge of a gas stick. This accomplishes two things. First, some air flow actually flows beneath gas sticks which would remove any escaping gas that travels beneath the gas sticks. Second, a large percentage of air flow flows up through narrow gaps 427–430. If holes 423 and 424 were located more under the center of the gas sticks the majority of air flow (because of the density of the modular block gas system) would simply flow beneath gas system 419 and out the outer edges of gas system 419. By placing holes 423 in regions where they are located not only underneath but also towards the outer edge of a gas stick, air flow is directed up through the narrow regions 427–430 in gas system 419 as well as directed beneath the gas sticks 431, 432.

Figure 5:
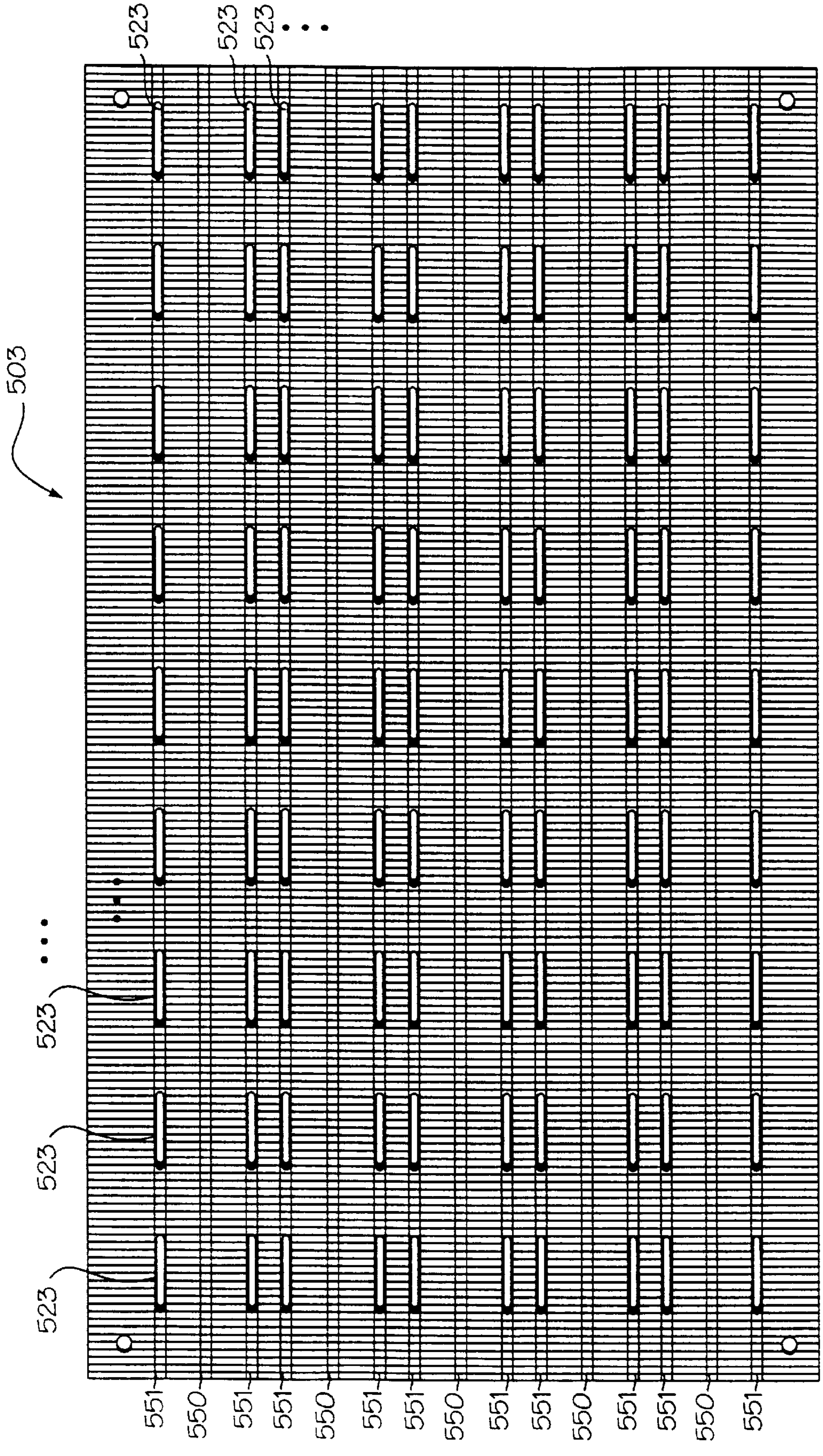
FIG. 5 is an illustration of a mounting plane for an embodiment of the present invention.

FIG. 5 shows a mounting plane 503 with the periodic structure of holes or openings 523. Holes 523 in an embodiment of the present invention are one inch long and separated by one inch along manifold mounting tracks 551. Manifold mounting tracks 551 are used to anchor manifold blocks (such as $317_1$ and $317_2$ in FIGS. 3*a* and 3*b*) and are typically 0.6 inches from alignment mounting tracks 550. Mounting tracks 550 are used to help align gas sticks on the mounting plane 503 as mentioned supra. Although an embodiment of the present invention envisions periodic placements of openings 523 in mounting plane 503; quite possibly, openings 523 could be custom placed for each specific gas system arrangement. However, an embodiment of the present invention opts for periodically placed openings 523, as shown in FIG. 5, because the manufacturing cost associated with a periodic pattern of holes 523 is much lower than custom formed holes 523.

There are various details of the design that require further elaboration.

First, referring back to FIG. 3*b*, if air is allowed to flow through openings 323 into wide gap 328 a considerable percentage of air flow flowing through mounting plane 308 has little potential to capture gases that may escape from the pair of gas sticks 331, 332, manifolds $317_{1\text{-}1}$ or functional elements 318. Therefore, plug inserts may be used to plug holes 323 that have no gas stick above them. This maximizes the amount of air flow that flows through the gas system 319. Referring to FIG. 4, holes 423 under wide gaps 425, 426 would be plugged in an embodiment of the present invention. Holes 424 in mounting plane 408 would not be plugged because they reside directly beneath gas sticks 431–5. By plugging holes 423 under wide gaps 425 and 426 and not plugging holes 424 beneath gas system 419, maximum air flow is directed to gas system 419 and all its associated narrow gaps (e.g. 427–430).

Second, referring to FIG. 3*a*, the air enters input port 302*a* and flows through channel 313 within the channel tip region 3131. Channel tip region 3131 is considered a section of channel 313. Channel tip region 3131, referring to FIGS. 3*a* and 3*c*, allows air to enter the encasement 301. The air enters at input port 302 and then travels through the channel 313 within the channel tip region (not seen in FIG. 3*c* because the cross sectional area of the channel tip region 3131 in the yz plane is equal to the cross sectional area of the input port 302 in the yz plane) and then through the mounting plane 308. The cross sectional area in the yz plane of input port 302 (and consequently the cross sectional area of the channel tip region 3131), ensures that improved apparatus 300 will meet industry safety requirements or customs. For example, industrial standard SEMI S2-93A sec. 10 requires that the apparatus capture reasonably conceivable gas leaks. This requirement is tested by deliberately injecting a 30 liter/min. flow of sulfur hexaflouride through a 0.25 inch diameter tube within the "line-of sight" of an opening (such as the entry port 302) in the encasement 301. A sniffer probe placed near the opening and outside the encasement 301 detects any test gas that leaks out of the opening in the encasement 301. Any such detection is a failure of the test.

The velocity of the sulfur hexaflouride test gas as it emerges from the 0.25 inch diameter tube (at 30 std liters/minute) is in excess of 5000 ft/min. Because of natural diffusion and mixing, the flow velocity falls off rapidly with distance from the test probe (to about 1000 ft/min six inches directly in front of the probe).

In order to ensure that the SEMI S2-93A specification is met, test gas must not escape the encasement 301 via the entry port 302. In order to ensure that test gas does not escape in this manner, the linear flow rate of air intake at the entry port 302 must reasonably exceed the flow rate from the test gas tube. In an embodiment of the invention, 1000 ft/min, being the flow rate six inches from the front of the test tube, is chosen as the nominal flow rate. A nominal flow rate is a flow rate reasonably chosen as a type of "worst case" gas leak. Nominal flow rates may be specifically used to assist in the development of apparatus 300 features that help ensure apparatus 300 will meet industry specifications (such as SEMI S2-93A) and customs. Thus, in an embodiment of the invention, the air intake velocity at input port 302 must reasonably exceed 1000 ft/min (the nominal flow rate). In this embodiment, 1500 ft/min is chosen as a linear flow rate at input port 302 that reasonably exceeds the 1000 ft/min nominal flow rate from the test gas tube.

Thus, in this embodiment of the invention, the design point for input port 302 and channel tip region 3131 (referring briefly back to FIG. 3*a*) is such that the flow rate through these elements is 1500 ft/min. The flow rate through these elements is a function of their cross sectional area in the yz plane and the volumetric flow rate of the air flow source (e.g., the air flow drawn by capture system 321 of FIG. 3*a*). Specifically, the linear flow rate through these elements is the volumetric flow rate drawn by the capture system 321 normalized by the cross sectional area in the yz plane of each of these elements (that is, the input port 302 or the channel tip region 3131).

For example, if the capture system 321 draws a volumetric flow rate of 150 $ft^3$/min, a cross sectional area of 1/10 $ft^2$ will produce a linear flow rate of 1500 ft/min. Similarly, for a volumetric flow rate of 100 $ft^3$/min, a cross sectional area of 1/15 $ft^2$ will also produce a linear flow rate of 1500 ft/min. Thus a specific linear flow rate at the input port 302 and channel tip region 3131 may be realized by modulating the cross sectional area of these elements in the yz plane in response to the volumetric flow rate of the flow source. It is beneficial to keep the volumetric flow rate of the capture system 321 low (e.g., 100–150 $ft^3$/min) to reduce the cost of handling and processing.

In summary, a combination of relatively high flow rates of air at the input port 302 with at least a few inches of comparable or identical high flow rate of air in a channel tip region 3131 guarantees that no sulfur hexaflouride test gas will be detected upstream of the air intake port 302—as it will have been swept back by the oncoming flow of air. Although the channel tip region 3131 a has identical cross section area in the yz plane, as depicted in FIG. 3*c*, this design choice is not a requirement. Again, the combination of high flow rates in the two structures (entry port 302 and channel tip region 3131), as compared to the nominal flow rate (e.g., from the test gas tube) ensures that gas does not escape the encasement 301 from entry port 302. The two structures may have different flow rates provided each has a flow rate reasonably higher than the nominal flow rate.

A third detail of the invention involves the sidewalls 309 of channel 313 in FIG. 3*a*. Sidewalls 309 help seal off or isolate channel 313 from the inside of encasement 301. Thus all air flow at input port 302 flows through mounting plane 308 and into the gas system 319 region.

Encasement 301 is typically dictated by customer demand. Therefore customers may require large or small encasement structures 301. They may even require various shape and size encasement structures 301. Various shape and size encasements 301 may result in various dead spots $\mathbf{314}_{1\text{-}4}$ within encasement 301. Dead spots $\mathbf{314}_{1\text{-}4}$ are essentially areas where there is little or no air flow in the encasement. Dead spots 314 are distinguished from narrow gaps or narrow regions 307 in that dead spots are associated with the lack of air flow in the encasement generally while narrow gaps or narrow regions are associated with the lack of air flow through the gas system specifically. For box like encasements, dead spots $\mathbf{314}_{1\text{-}4}$ typically exist in corners.

As discussed, industry standards require various levels of air flow throughout the entirety of encasement 301. For example, a common interpretation of SEMI S2-93A sec. 10 requires a minimum of 50 feet per minute throughout encasement 301. Dead spots 314 result in failure to meet this requirement. Furthermore, industry requirements include 100 feet per minute next to any flammable gas critical connection (such as where two neighboring blocks 316 meet) and/or 200 feet per minute near any critical connection of silane. Dead spots 314 may threaten apparatus 300 acceptance of these standards.

In order to eliminate dead spots $\mathbf{314}_{1\text{-}4}$, a number of approaches may be taken. For dead spots $\mathbf{314}_{1\text{-}2}$ that occur near channel 313 sidewall $\mathbf{309}_{1\text{-}2}$, a passage $\mathbf{311}_{1\text{-}2}$ may be formed in sidewall $\mathbf{309}_{1\text{-}2}$. A passage essentially couples fluid flow between the encasement 301 and the channel 313. Passage $\mathbf{311}_{1\text{-}2}$ allows for an appreciable amount of flow $\mathbf{310}_{1\text{-}2}$ from channel 313*a* into corner $\mathbf{314}_{1\text{-}2}$. Furthermore input ports $\mathbf{312}_{1\text{-}2}$ may be added at various strategic locations around encasement 301 to specifically eliminate dead spots $\mathbf{314}_{3\text{-}4}$. An additional input port 312 is a port in the encasement structure that is placed in such a manner to eliminate a dead spot (or dead spots) within the encasement or to introduce air flow within a narrow gap.

Thus, additional entry ports may be added at various positions on the encasement 301 in order to create a linear flow (e.g., in the −x direction) through encasement structure 301.

Figure 6:
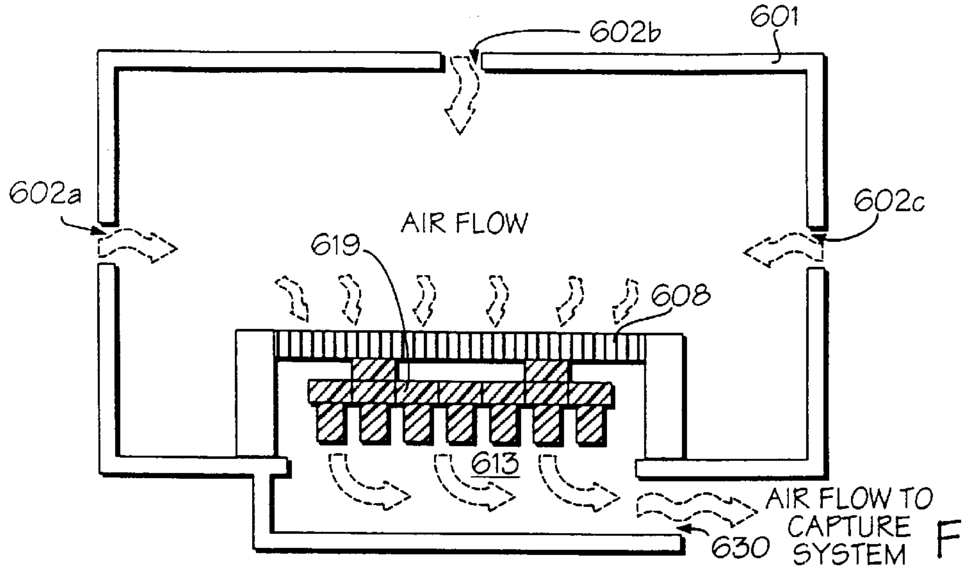
FIG. 6 is an illustration of a first alternate embodiment.
Figure 7:
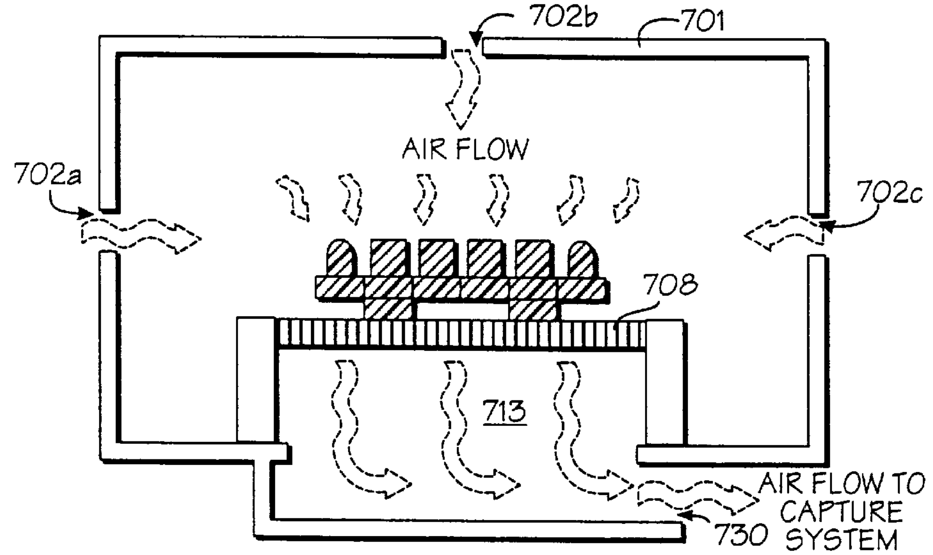
FIG. 7 is an illustration of a second alternate embodiment.
Figure 8:
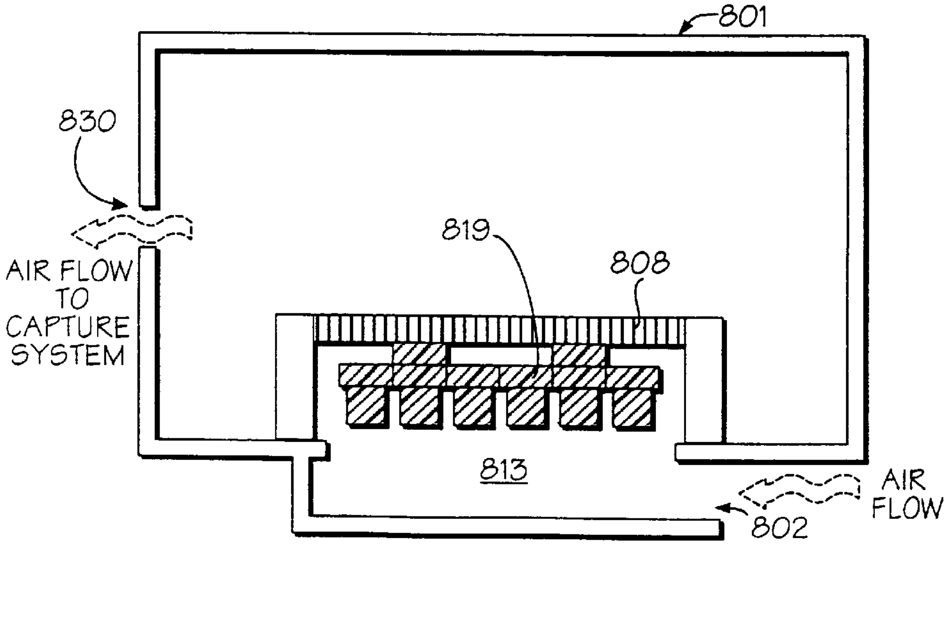
FIG. 8 is an illustration of a third alternate embodiment.

FIGS. 6–8 show alternate embodiments of the design. In the embodiment of FIG. 6, the gas system 619 is inverted in comparison to the previously described embodiment of the present invention. Furthermore, air flows in the opposite direction. Thus channel 613 connects gas system 619 exit surface area to exit port 630. The capture system (not shown) is connected to the exit port 630. Air flow enters encasement 601 at various entry ports 602*a*–*c*. Although more than one entry port 602*a*–*c* is shown, this is not a required limitation; however, in light of applicable industry standards, it is recommended.

FIG. 7 shows another alternate embodiment. The embodiment in FIG. 7 structurally is very similar to an embodiment of the present invention. The main difference is the direction of air flow. Thus in this embodiment, the channel 713 connects the mounting plane 708 exit surface area to exit port 730. Again, the capture system is not shown. Air flow enters encasement 701 at various entry ports 702*a*–*c*. Again, although more than one entry port is shown, this is not a required limitation; however, in light of applicable industry standards, it is recommended.

Another embodiment is shown in FIG. 8. The embodiment of FIG. 8 has a structure similar to that in FIG. 6. That is, the gas system 819 is inverted. In this embodiment, the channel 813 connects the gas system 819 enter surface area with the entry port 802. The capture system (not shown) is connected to exit port 830. Air enters at entry port 802 and flows through gas system 819 through mounting plane 808 into encasement 801.

It is important to note that all details featured in the described embodiment of the present invention are applicable to the alternate embodiments shown in FIGS. 6–8. Thus passages in channel sidewalls to eliminate dead spots, plugs in mounting planes to refuse air flow through wide gaps in gas systems and narrow entry ports in order to maximize air flow through entry ports (such that test gas is not allowed to escape out an entry port) are all applicable to all the alternate embodiments.

It is important to note that the scope of this invention, although directed to gas systems in general, can be applied to other problems where structural arrangements require fluid flow of some sort (e.g., gas or liquid). Thus this invention applies to structural arrangements generally, not only gas systems. A structural arrangement is essentially any structure that requires fluid (e.g., gas or liquid) flow. The gas system described previously is a form of structural arrangement. A dense arrangement of structure is a structural arrangement that has at least one narrow gap. A narrow gap is a gap that will have at most negligible fluid flow if fluid flow is not strategically directed at the structural arrangement in such a manner as to introduce fluid flow through the narrow gap.

Furthermore, similar to the fact the invention is not limited only to gas systems but may also be applied to any structural arrangement requiring fluid flow; the invention is also not limited merely to mounting planes (of the type disclosed in U.S. application Ser. No. 08/893,773) that are perforated. As such, any structure not the structural arrangement having at least one opening through which fluid flow is permissible (that is, sieve-like structures) are deemed part of the present invention. Sieve-like structures include but are not limited to screens or periodically fixed bars or rails.

Although an embodiment of the present invention envisions a perforated mounting plane to create a sieve-like structure; the present invention is not limited to an apparatus where the structural arrangement is directly mounted to a sieve-like structure. For example, referring back to FIG. 3*a*, air flow may be introduced into gas system 319 at the "top" of gas system 319 (i.e., flow travels in the −y direction). A sieve-like structure may be placed above the gas system 319 so that air flow passes through the sieve like structure before passing through gas system 319. In such an embodiment, the gas system 319 must still be mounted to a mounting plane 308. However, the mounting plane does not require perforation if flow may escape the gas system 319 through its sides (e.g., in the z or x directions). Thus, the structural arrangement does not absolutely require fixation to the sieve like structure.

As the invention applies not only to gas systems and mounting planes but also to, more generally, structural arrangements and sieve like structures, definitions analogous to gas system enter and exit surface areas exist for structural arrangement enter and exit surface areas. That is, a structural arrangement enter surface area is the surface through which all flow flowing through the structural arrangement must cross. Furthermore, a structural arrangement exit surface area is the surface area through which all flow passing through the structural arrangement must pass to escape the structural arrangement region. Also, a sieve like structure enter surface area is the surface area through which all flow that enters the sieve like structure must cross. Finally, the sieve like structure exit surface area is the surface area through which all fluid flow that exits the sieve like structure must cross. Thus, definitions analogous to mounting plane enter and exit surface areas exist for sieve like structure enter and exit surface areas as well. Furthermore, structural arrangements and sieve like structures do not necessarily need to be planar. For example, cylindrical enter and exit surface areas would result from a cylindrical structures.

It is conceivable that some designs may not require maximum flow through the structural arrangement, thus the invention is not necessarily limited solely to designs where sieve like structure surface areas are approximately equal to structural arrangement surface areas. Nor is the invention necessarily limited to designs where the structural arrangement surface areas are approximately the same shape as the sieve like structure surface areas. The invention is also not limited to designs where sieve like structure enter surface areas are equal to sieve like structure exit surface areas. Nor is the invention limited to designs where structural arrangement enter surface areas are equal to structural arrangement exit surface areas. Thus, a large range of various dimensional relationships between the various surface areas are possible under the present invention. The various relationships will likely be a function of encasement 301 size (typically dictated by customers) and maximum or minimum flow rates dictated by the capture system 321 or industry standards.

Thus, a general description of a sieve like structure for removing dead spots within the a structural arrangement as well as a containment system for a modular gas system that introduces air flow through the mounting plane to remove dead spots within the gas system has been described.

We claim:

1. An apparatus, said apparatus comprising:

a) an encasement;

b) at least one entry port for entry of a fluid flow into said encasement;

c) at least one exit port for exit of said fluid flow from said encasement;

d) a dense structural arrangement, said dense structural arrangement having an enter surface area and an exit surface area, wherein said dense structural arrangement comprises elements of a gas or a fluid system;

e) a sieve-like structure, said sieve-like structure having at least one opening, said sieve-like structure having an enter surface area and an exit surface area, said dense structural arrangement mounted to said sieve-like structure; and f) a channel, said channel coupling at least one of said exit ports to either said sieve-like structure exit surface area or said dense structural arrangement exit surface area, or said channel coupling at least one of said entry ports to either said dense structural arrangement enter surface area or said sieve-like structure enter surface area.

2. The dense structural arrangement of claim 1 further comprising modular gas system building blocks.

3. The apparatus of claim 1 wherein either of said dense structural arrangement surface areas is approximately equal to either of said sieve like structure surface areas.

4. The apparatus of claim 3 wherein either of said dense structural arrangement surface areas is approximately the same in size and shape as either of said sieve like structure surface areas.

5. The apparatus of claim 1 further comprising an air flow source, said air flow source having a volumetric flow rate, said channel having a channel tip region, at least one of said entry ports having a first cross sectional surface area, said channel tip region having a second cross sectional area, both said first and said second cross sectional areas less than or equal to said volumetric flow rate of said air flow source normalized by a nominal linear flow rate.

6. The openings in said sieve-like structure of claim 1 wherein said openings in said sieve-like structure are placed in a periodic pattern.

7. The sieve-like structure in claim 1 further comprising plugs inserted in said openings in said sieve-like structure, said plugs located near a wide gap in said dense structural arrangement.

8. The opening in said sieve-like structure of claim 1 wherein said opening is located near a narrow gap in said structural arrangement.

9. The encasement of claim 1 further comprising at least one additional entry port.

10. The fluid flow of claim 1 wherein said fluid flow is a gas fluid flow.

11. The channel of claim 1 wherein said channel couples said entry port and said sieve-like structure enter surface area.

12. The channel of claim 11 wherein said channel isolates said fluid flow such that substantially all of said fluid flow passes through said openings in said sieve-like structure.

13. The channel of claim 11 wherein said channel further comprises at least one passage from said channel to said encasement.

14. The channel of claim 1 wherein said channel couples said exit port and said sieve-like structure exit surface area.

15. The channel of claim 14 wherein said channel isolates said fluid flow such that substantially all of said fluid flow passes through said openings in said sieve-like structure.

16. The channel of claim 14 wherein said channel further comprises at least one passage from said encasement to said channel.

17. The channel of claim 1 wherein said channel couples said entry port and said dense structural arrangement enter surface area.

18. The channel of claim 17 wherein said channel isolates said fluid flow such that substantially all of said fluid flow passes through said openings in said sieve-like structure.

19. The channel of claim 17 wherein said channel further comprises at least one passage from said channel to said encasement.

20. The channel of claim 1 wherein said channel couples said exit port and said dense structural arrangement exit surface area.

21. The channel of claim 20 wherein said channel isolates said fluid flow such that substantially all of said fluid flow passes through said openings in said sieve-like structure.

22. The channel of claim 21 wherein said channel further comprises at least one passage from said encasement to said channel.

23. An apparatus, said apparatus comprising:

a) an encasement b) at least one entry port for entry of a gas fluid flow into said encasement;

c) at least one exit port for exit of said gas fluid flow from said encasement;

d) a gas system, said gas system having an enter surface area and an exit surface area, said gas system comprising modular gas system components;

e) a mounting plane, said mounting plane having openings, said mounting plane having an enter surface area and an exit surface area, said gas system mounted to either of said mounting plane surface areas; and f) a channel, said channel coupling at least one of said exit ports to either said mounting plane exit surface area or said gas system exit surface area, or said channel coupling at least one of said entry ports to either said gas system enter surface area or said mounting plane enter surface areas.

24. The apparatus of claim 23 wherein said gas system surface area is substantially the same in size and shape of said mounting plane surface area.

25. The apparatus of claim 23 further comprising an air flow source, said air flow source having a volumetric flow rate, said channel having a channel tip region, at least one of said entry ports having a first cross sectional area, said channel tip region having a second cross sectional surface area, said first and second surface areas less than or equal to said volumetric flow rate of said air flow source normalized by a nominal linear flow rate.

26. The openings in said mounting plane of claim 23 wherein said openings in said mounting plane are one inch in length, said openings in said mounting plane placed one inch apart.

27. The mounting plane in claim 23 further comprising plugs inserted in a first of said openings in said mounting plane, said first opening near a wide gap in said gas system.

28. The opening in said mounting plane of claim 23 wherein said opening is located near a narrow gap in said gas system.

29. The opening in said mounting plane of claim 23 wherein said opening is located near the outer edge of a gas stick.

30. The encasement of claim 23 further comprising at least one additional entry port.

31. The channel of claim 23 wherein said channel couples said entry port and said mounting plane enter surface area.

32. The channel of claim 31 wherein said channel isolates said gas fluid flow such that substantially all of said gas fluid flow passes through said openings in said mounting plane.

33. The channel of claim 31 wherein said channel further comprises at least one passage from said channel to said encasement.

34. The channel of claim 23 wherein said channel couples said exit port and said mounting plane exit surface area.

35. The channel of claim 34 wherein said channel isolates said gas fluid flow such that substantially all of said gas fluid flow passes through said openings in said mounting plane.

36. The channel of claim 34 wherein said channel further comprises at least one passage from said encasement to said channel.

37. The channel of claim 23 wherein said channel couples said entry port and said gas system enter surface area.

38. The channel of claim 37 wherein said channel isolates said gas fluid flow such that substantially all of said gas fluid flow passes through said openings in said mounting plane.

39. The channel of claim 37 wherein said channel further comprises at least one passage from said channel to said encasement.

40. The channel of claim 23 wherein said channel couples said exit port and said gas system exit surface area.

41. The channel of claim 40 wherein said channel isolates said gas fluid flow such that substantially all of said gas fluid flow passes through said openings in said mounting plane.

42. The channel of claim 40 wherein said channel further comprises at least one passage from said encasement to said channel.

43. An apparatus, said apparatus comprising:

a) an encasement b) at least one entry port for entry of a gas fluid flow into said encasement;

c) at least one exit port for exit of said gas fluid flow from said encasement;

d) a gas system, said gas system having an enter surface area and an exit surface area, said gas system having at least one manifold block, said gas system having a plurality of gas sticks, said gas sticks mounted to at least one of said manifold base blocks, each of said gas sticks having a plurality of modular base blocks, at least one of said manifold blocks coupling at least two gas sticks, said gas system having a plurality of functional elements, each of said functional elements mounted to a modular base block, said gas system having narrow gaps;

e) a mounting plane, said mounting plane having openings, said mounting plane having an enter surface area and an exit surface area, said manifold blocks mounted to either of said mounting plane surface areas; and f) a channel, said channel coupling at least one of said exit ports to either said mounting plane exit surface area or said gas system exit surface area, or said channel coupling at least one of said entry ports to either said gas system enter surface area or said mounting plane enter surface areas.

44. The channel of claim 43 wherein said channel couples said entry port and said mounting plane enter surface area.

45. The channel of claim 43 wherein said channel couples said exit port and said mounting plane exit surface area.

46. The channel of claim 43 wherein said channel couples said entry port and said gas system enter surface area.

47. The channel of claim 43 wherein said channel couples said exit port and said gas system exit surface area.

48. A method, said method comprising:

(a) introducing a fluid flow into at least one entry port of an encasement having a gas system that comprises modular components;

(b) directing said fluid flow into a gas system mounting plane enter surface area; and (c) directing said fluid flow from a gas system mounting plane exit surface area to at least one exit port of said encasement.

49. The method of claim 48 wherein said fluid flow is at least 50 feet per minute through said encasement.

50. The method of claim 48 wherein said fluid flow is at least 100 feet per minute next to a flammable gas connection in said gas system.

51. The method of claim 48 wherein said fluid flow is at least 200 feet per minute next to a pyrophoric gas connection.

52. The method of claim 51 wherein said pyrophoric gas further comprises silane.

53. The method of claim 48 further comprising blocking said fluid flow near a wide gap in said gas system.

54. The method of claim 48 further comprising directing said fluid flow through a narrow gap in said gas system.

55. The method of claim 48 further comprising directing said fluid flow near the outer edge of a gas stick within said gas system.

56. The method of claim 48 further comprising directing said fluid flow through a channel that couples said entry port and said mounting plane enter surface area.

57. The method of claim 56 further comprising directing a portion of said fluid flow between said channel and said encasement without flowing through either said mounting plane enter surface area or said mounting plane exit surface area.

58. The method of claim 48 further comprising directing a second fluid flow directly into said encasement that does not flow through either said mounting plane enter surface area or said mounting plane exit surface area.

* * * * *